United States Patent [19]
Bartelt et al.

[11] Patent Number: 4,728,193
[45] Date of Patent: Mar. 1, 1988

[54] PRECISION AUTOMATIC MASK-WAFER ALIGNMENT SYSTEM

[75] Inventors: John L. Bartelt, Camarillo; Ross D. Oleny, Canoga Park, both of Calif.

[73] Assignee: Hughes Aircraft Company, Los Angeles, Calif.

[21] Appl. No.: 940,390

[22] Filed: Dec. 11, 1986

[51] Int. Cl.$^4$ .............................................. G01B 9/02
[52] U.S. Cl. .................................. 356/356; 356/363; 356/401
[58] Field of Search ....................... 356/356, 363, 401; 250/237 G

[56] References Cited

U.S. PATENT DOCUMENTS 4,200,395  4/1980  Smith et al. ...................... 356/363 X
4,595,295  6/1986  Welczynski ......................... 356/401
4,596,467  6/1986  Bartelt ............................. 356/356 X

OTHER PUBLICATIONS

Flamholz et al., "High Resolution Mask Overlay Comparator", IBM Tech. Disclos. Bull., vol. 21, No. 7, pp. 2839–2844, 12/78.

Primary Examiner—Davis L. Willis
Assistant Examiner—Matthew W. Koren
Attorney, Agent, or Firm—Wanda K. Denson-Low; A. W. Karambelas

[57] ABSTRACT

An interferometric alignment and position detector system for determining relative location of an object is provided. A composite diffraction grating is provided with the object. A laser can provide a collimated coherent light beam directed so as to impinge on the composite diffraction grating. A beam splitter can collect at least two pairs of diffracted light beams from the composite diffraction grating and can combine the pairs of diffracted light beams to provide interference fringe patterns. Apparatus is provided for detecting the interference fringe patterns to provide a measurement of the intensity distribution from which the relative location can be established.

33 Claims, 11 Drawing Figures

6 MICRON GRATING

FIG. 9b

7 MICRON GRATING

FIG. 9c 6-7 COMPOSITE GRATING
PERIOD

PRECISION AUTOMATIC MASK-WAFER ALIGNMENT SYSTEM

The U.S. Government has rights in this application pursuant to Contract No. N66001-86-C-0110, which was awarded by the Department of the Navy.

BACKGROUND OF THE INVENTION

1. Field of the Invention

The present invention relates generally to a precise alignment system and particularly to an alignment system that can provide an automatic detection in a proximity and projection lithography system to transfer a high resolution pattern from a mask to a substrate.

2. Description of the Prior Art

The miniaturization of integrated circuits has created a constant demand to precisely align a mask with a substrate for each of the lithographic steps in the fabrication of an integrated circuit on a substrate. The higher the accuracy of alignment, the greater capability is provided to reduce the minimum feature size of an integrated circuit.

In providing integrated circuits having feature sizes below 1.0 $\mu$m, the prior art has adopted various interferomic techniques, such as disclosed in D. C. Flanders et al., "A New Interferometric Alignment Technique," Vol. 31, No. 7, Oct. 1, 1977, pp. 426–428, that discloses the basic interferomic technique. In this regard, diffraction gratings of identical period are provided on the facing surfaces of a mask and substrate. A beam of laser light is normally directed to the diffraction grating planes with the result that diffracted light is returned at discrete angles from the incident laser beam. Generally, those light beams experiencing the smallest unit of an angular diffraction, this is, a net first order diffraction, are utilized in the Flanders et al. technique. Measurements of the relative difference in the plus and minus first order diffraction group intensities are used to obtain an indication of the alignment of the mask and substrate gratings. Any relative displacement of the mask with respect to the substrate within the period of the gratings will show a corresponding variation in the relative intensities of the first order diffraction groups due to the mutual interference between beams within each group. Theoretically, a zero intensity difference between the plus and minus first order diffraction groups will occur only when the mask and the substrate diffraction grating lines are aligned. The Flanders et al. technique proposed that alignment errors as small as 200 angstroms could be detected.

U.S. Pat. No. 4,596,467 is the work of one of the inventors of the present application, assigned to the same assignee. This patent discusses the various problems that are inherent in the Flanders et al. technique and attempts to address these problems, such as the gap or specific spacing between the mask and substrate that can introduce various problems that prevent any discrimination between mask and substrate grating alignment errors from the variables of the spacing between the mask and the substrate.

This patent teaches the use of dissimilar grating periods for the mask and substrate gratings. An indication of alignment between the mask and the substrate gratings is obtained by comparing the relative apparent movement of fringes produced by the first order of diffracted light beams that are effectively diffracted only by the mask with that due to be effectively diffracted by the substrate. The U.S. Pat. No. 4,596,467 embodiments require precise and complicated optics that are cumbersome to align in a vacuum lithography environment.

The articles "A Dual Grating Alignment Technique For X-Ray Lithography" by Kinoshita et al., J. Vac. Sci. Technol., B, Vol. 1, No. 4, Oct.–Dec. 1983, pg. 1276, and "A High-Resolution Laser Scale Interferometer" by Iwaoka et al., SPIE, Aug. 1984, are cited of general interest.

Finally, there have been attempts to provide a precise alignment system for positioning singular objects. As with the proximity and projection lithography systems, there is still a demand to increase the accuracy of such systems.

Thus, there is still a demand in the prior art to provide improved interferomic alignment systems.

SUMMARY OF THE INVENTION

The purpose of the present invention is to provide a highly accurate alignment system such as a lithographic alignment system utilizing an improved automatic interferometric technique.

The present invention incorporates a composite grating that exhibits diffraction properties similar to those that would be displayed by the two component gratings individually to produce two pairs of diffracted light beams that can be subsequently coherently combined to provide interference fringe patterns.

The present invention can be accomplished in a mask and substrate alignment system wherein the substrate has a first composite diffraction grating formed thereon, and a mask has a second composite diffraction grating that can be positioned relative to the substrate so that the gratings are superimposed over each other. A source of monochromatic coherent light, such as a laser, can be directed to impinge on the grating of the mask and therethrough onto the grating of the substrate. Preferably, the laser light is positioned at an angle offset from a perpendicular plane extending through the plane of the mask and the substrate. The positioning of the laser at an offset position permits the alignment system to work without interfering with the lithography energy beam during exposure of the wafer substrate. The mask is not required to move to detect its position relative to the wafer and any vertical differences between the mask and substrate spacing will not produce any variation in the alignment sensitivity. It is highly desirable that there not be any moving component parts and that a relatively simple optical system be utilized that is compatible with minimizing space requirements in a vacuum environment. Preferably, a single beam splitter will be used to recombine the plus and minus order diffracted beams from both the mask and wafer gratings to generate interference fringes for each channel or axis of movement. The beam splitter can be adjusted for translation and for rotation about its own center. The fringes generated at the intersection of the recombined beams will yield complete information as to the positioning of the gratings. The beam splitter itself is positioned so that its rotation and translation from the optical axis will cause these intersections of the recombined beams to be at the face of a conventional photodetector array. The respective gratings on the mask and substrate will each be composite gratings to provide an extension of the capture range of the alignment system to exceed the dead reckoning preliminary accuracy of the wafer stage of 20 $\mu$m. The composite gratings extend the capture range but still retain the accuracy benefits of a smaller grating as a result of the beat frequency characteristics of the pattern.

As can be appreciated, the present invention can also be used as a highly accurate position detector for determining relative location of an object. Finally, the present invention can be incorporated as a feature of a proximity and projection lithography system to improve its accuracy.

BRIEF DESCRIPTION OF THE DRAWINGS

These and other attended advantages of the present invention will become apparent and readily appreciated as the same becomes better understood by reference to the following detailed description when considered in connection with the accompanying drawings, in which like reference numerals designate like parts throughout the figures.

DESCRIPTION OF THE PREFERRED EMBODIMENTS

The following description is provided to enable any person skilled in the lithography field to make and use the invention, and sets forth the best mode contemplated by the inventor for carrying out his invention. Various modifications, however, will be readily apparent to a person skilled in the art since the generic principles of the present invention have been defined specifically to provide an improved alignment system, such as a position detector or a lithography alignment system.

The present invention can be used in a proximity type, high resolution masked X-ray or ion beam lithography (MIBL) system. Typically, such a system includes a collimated ion beam source, a relatively immobile ion-channeling replication mask, and an x-y translation stage including a mount for holding a substrate. The substrate and mask are provided with a plurality of composite or complex gratings.

Figures 1, 2, 3:
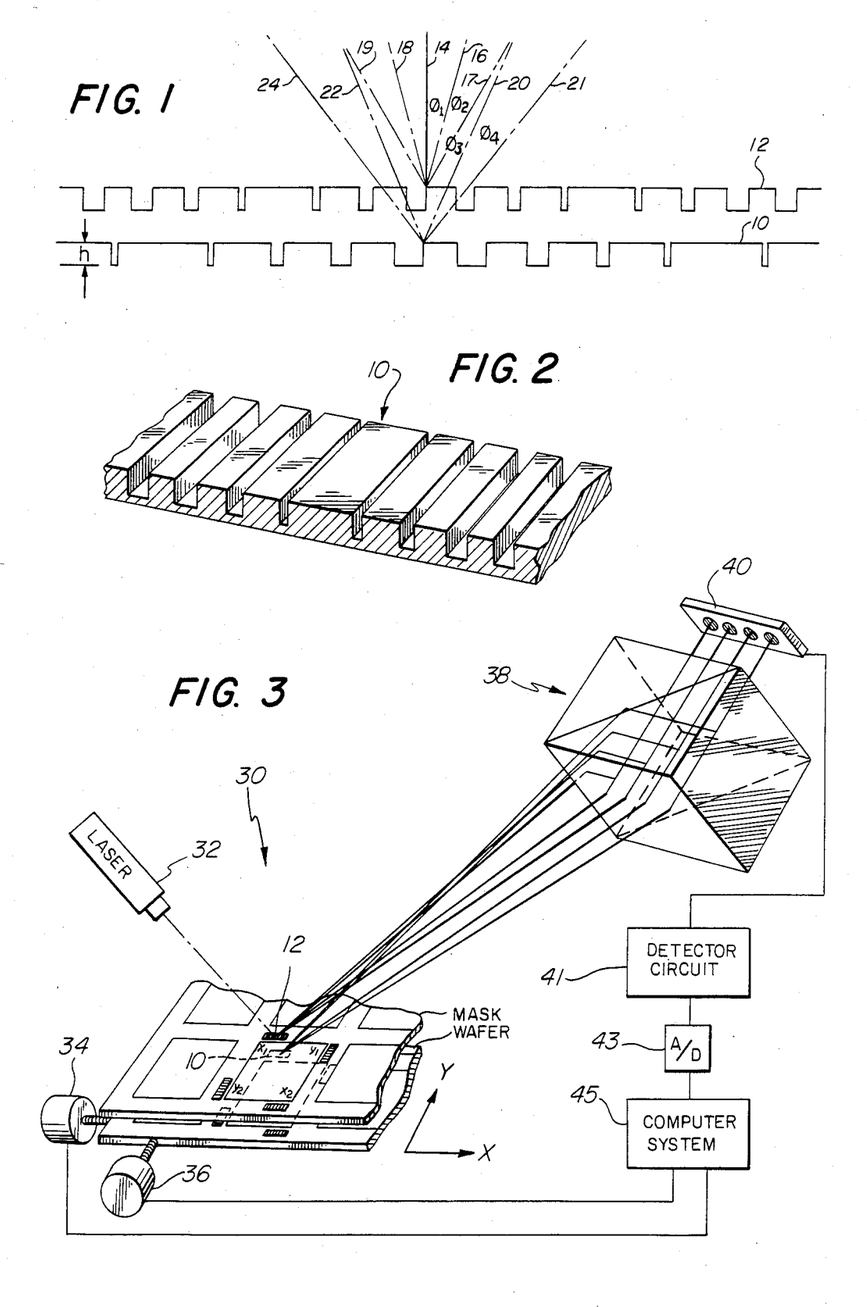
FIG. 1 is a schematic representation of superimposed composite diffraction gratings of the mask and substrate and the diffraction of light therefrom.
FIG. 2 is a perspective schematic representation of a composite diffraction grating pattern.
FIG. 3 is a schematic partial perspective view of a first embodiment of an apparatus employing the present invention.
Figure 9A:
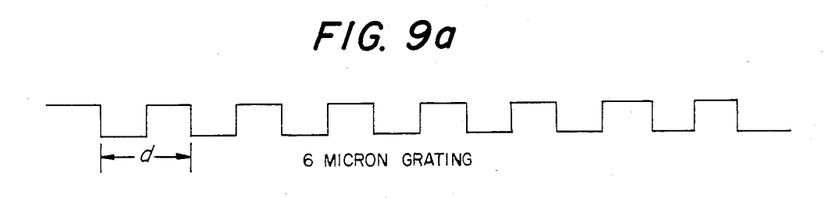
FIGS. 9a, 9b and 9c disclose, respectively, a 6 micron grating, a 7 micron grating and a composite 6-7 grating.
Figure 9B:
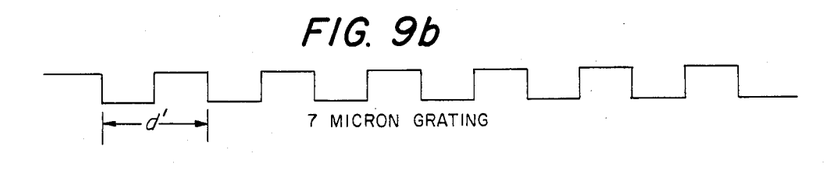
Figure 9C:
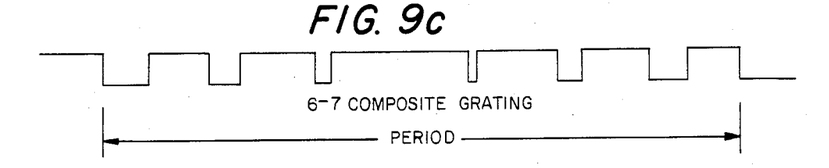

A composite or complex grating can be understood with reference to FIGS. 9a, 9b and 9c wherein a schematic cross-sectional view of a 6 micron component grating, a 7 micron component grating and the composite or complex 6-7 hybrid grating is disclosed, respectively. A perspective view of composite grating 10 is shown in FIG. 2. Basically, the composite grating is the sum (logical and) of the component gratings of different uniform periods printed at a single location. The composite pattern may also be formed from other logical combinations of the primary gratings, e.g., logical or, exclusive or, not and, etc. The composite diffraction grating exhibits the diffraction properties similar to those that would be displayed by the two component gratings individually. The composite grating can extend the capture range of the alignment system to exceed the dead reckoning position accuracy of the wafer stage, e.g., ~20 μm. As can be appreciated, the ultimate accuracy of the alignment system is dependent upon the grating period. Thus, the smaller the grating period, the more accurate the alignment system. The capture range, however, is only one-half of the grating period because the phase of the interference signal shifts by $2\pi$ for a change in grating location of half the grating period. Thus, for a 6 μm grating, the capture range is 3 μm.

The composite grating extends the capture range by the multiple of the individual component gratings ($6\times7/2=21$ μm capture range) while retaining the accuracy benefits of the smaller gratings (6 μm). This extension of the capture range is due to the beat frequency characteristics of the pattern. If the composite grating were moved 21 μm, an identical interference pattern would again appear.

The superimposed printing of the two component gratings into a composite grating yields several benefits. First, it saves space in the kerf area. It also allows simultaneous illumination of both gratings by a single incident laser beam. It also avoids any phase problems that might arise between the patterns due to a temperature change or some processing effect. The composite gratings can be approximately $0.5\times1.0$ mm in size.

The gratings can be formed, using ordinary photolithographic techniques, such as a simple resist pattern on the surface of the substrate or etched directly into either the surface of the substrate or a layer formed thereon. The height h of the diffraction grating lines is generally selected to optimize its reflective diffraction efficiency with respect to a given diffraction order, preferably the first, and as such, is selected depending on the wavelength of the incident alignment light beam, the index of refraction of the substrate and any layers thereon.

Preferably, the source of incident alignment light is a low power laser producing a well collimated beam of coherent light. While a variety of lasers may be used, such as HeNe and Ar+ to provide an alignment light beam at any one of a wide range of frequencies, a HeNe laser emitting light having a wavelength of approximately 632.8 nanometers is preferred. For a diffraction grating etched into a silicon substrate, and generally meeting the above criteria, this incident beam wavelength corresponds to a diffraction grating line height H of approximately 3000 Å.

The mask grating is formed as a relief pattern which is provided as part of the ion-channeling mask. One means for fabricating such a mask has been shown in U.S. Ser. No. 867,659 filed on May 27, 1986, and assigned to the present assignee. Dissimilar grating periods are chosen for the mask and substrate gratings in accordance with the present invention. The periods in the composite mask grating are preferably chosen to be larger than that of the substrate to obtain the greater transmission efficiency inherent with relatively larger grating periods and, thereby, optimize the amount of zeroth order diffraction light passing through the mask grating.

As shown in FIG. 1, the mask and substrate are overlaid in close proximity to one another so as to superimpose the dissimilar gratings of the mask and substrate.

This allows alignment of the mask and substrate in both the x and y direction of the coordinate system and also rotation, as shown in FIG. 3.

Referring now to FIG. 1, a schematic representation of the diffraction of an incident beam of collimated coherent light 14 from dissimilar superimposed composite gratings 10, 12 is shown. The direction of the beams generated by the diffraction of the incident beam 14 is given by:

$$n\lambda = d(\sin\phi_n - \sin\phi_1) \qquad (1)$$

wherein n is the diffraction group number, $\lambda$ is the incident beam 14 wavelength, d is one of the periods in the composite grating and $\phi_n$ and $\phi_1$ are the angles that the diffracted and incident beams make with respect to the normal of the diffraction grating planes for each component grating. Considering for purposes of the present invention, only the first order diffraction group and selecting $\phi = 0$, the pair of diffracted beam angles $\phi_1$, $\phi_2$ and $\phi_3$, $\phi_4$, from the plane of the incident beam 14 normal to the mask and substrate gratings and parallel to the length of the diffraction grating lines is given by $$\phi_n = \sin^{-1}(\lambda/d) \qquad (2)$$

The use of dissimilar superimposed composite diffraction gratings thus result in the spatial separation of a pair of respective plus and minus first order diffraction beams as respectively diffracted from both the substrate grating 10 and the mask grating 12. The selection of the particular grating periods is based on the practical considerations of providing sufficient spatial separation between the pairs of respective plus and minus first order diffracted beams, respectively shown as 16, 17, 20, 21 and 18, 19, 22, 24, so as to permit their subsequent manipulation in accordance with the present invention. The selection of the grating periods is also based on the practical consideration that the capture range of the alignment technique of the present invention is approximately one-half of the product of periods while accuracy is proportional to the smallest period. The relative phase of the plus and minus order diffracted beams directed at diffraction angles given by Equation 2 for a given order will vary as the position of the corresponding diffraction grating is shifted laterally. The plus and minus order beams are coherently recombined with the result that the position information is converted to an intensity variable by mutual coherent interference. The magnitude of the beam intensity and the position of a grating can be related by deriving the time averaged Poynting vector magnitude for the recombined diffracted beams. In the context of the present invention, for the mask grating alone (or, in the present of the substrate grating where the reflected zeroth order substrate grating reflectively diffracted beam is otherwise blocked) or the substrate grating either in the presence or absence of the mask grating, the time average Poynting vector magnitude is:

$$|S_x| = \cos^2\left(\left[\pi\frac{x}{p} + \frac{2\epsilon}{d} + n\right]\right) \qquad (3)$$

where $\epsilon$ is the lateral displacement, d is the grating period of the corresponding displaced grating n is an arbitrary integer, x is a position along the fringe pattern, and p is a constant determined by the angle between the plus and minus beams ($\phi$). The cosine squared function evaluates to two complete cycles of intensity as $\epsilon$ goes from zero to d.

In the preferred embodiment, a composite grating is used, as shown in the schematic perspective view of FIG. 2, in the kerf area and represents the sum of two component gratings of uniform period presented at a single location. This pattern exhibits diffraction properties similar to those displayed by the two component gratings individually.

It is possible to recognize from Equation 3 that the intensity magnitude of a recombined beam is dependent only on the lateral position of a single corresponding grating and not at all dependent on the gap distance between the mask and substrate gratings. Thus, when Equation 3 applies, the determination of alignment is independent of the presence of a mask to substrate gap or any variation therein.

Referring to FIG. 3, a preferred embodiment of the present invention in a lithography application is schematically disclosed. The alignment apparatus 30 includes a laser source 32 that is directed towards the substrate and mask gratings 12 and 10. The laser is positioned at an angle to a perpendicular axis extending normal to the mask and substrate. Thus, the laser 32 is positioned out of the optical path of the lithography process. Appropriate stepper motors 34 and 36 or other mechanisms, such as disclosed in U.S. Pat. No. 4,528,490, can be utilized for alignment of either the wafer or the mask. The substrate and mask gratings are shown not to scale and are selected to diffract the first order diffracted beams towards a collecting beam splitter (recombiner) 38. As can be seen, the pairs of separate first order diffracted beams are recombined by mutual coherent interference at the beam splitter 38 and are directed to a detector array 40. The detector array is preferably a semiconductor linear detector array selected as being sensitive to optical radiation of the same wavelength as the light emitted by the laser light source 32, such as a Reticon 3456 cell photodetector having cells that are 7 $\mu$m wide. Since the component grating periods of the substrate and mask component gratings 10 and 12 are dissimilar to assure spatial separation of the beams, the beam splitter 38 should be placed at a unique position, again off-axis from the lithography process so that only the first order pairs of diffracted beams that have further experienced only a single nonzero order diffraction are collected and can be directed to cross at the array detector. The beam splitter 38 should be mounted for rotation about its center for alignment. The other diffracted beams, as well as all first order diffraction groups beams that have been multiply diffracted, will emerge from the substrate and mask gratings at substantially different spatial distributed diffraction angles to permit the selection of only the first order singularly diffracted beams for alignment purposes.

The eight beams shown emerging from the mask-wafer stack in FIG. 3 are from the composite gratings on both the mask and wafer. Each composite grating produces two +1 and two −1 order beams. These are recombined by the beam splitter 38 in pairs yielding two fringe patterns from the wafer and two fringe patterns from the mask at the photodetector array 40. FIG. 3 illustrates the necessary optical components for one axis of the alignment system. Four are required ($X_1$, $X_2$, $Y_1$, $Y_2$) each providing one-dimensional alignment information for a single axis. Since the measurement method for each channel or axis is the same, only one channel will be illustrated and explained although it must be recognized that for readings of local alignment, information would be collected at the same time and processed in the same manner for several channels.

Thus, a number of alignment systems 30 are utilized as subsystems within the lithography system. Each alignment subsystems is utilized to derive x or y alignment information from a correspondingly superimposed dissimilar composite diffraction grating pair. As can be seen in FIG. 3, preferably at least four such subsystems can be utilized with the corresponding dissimilar superimposed grating pairs spaced equally about the periphery of a typical square area. The diagonally disposed grating pair share a common grating line orientation that is rotated in a plane 90° from that of the other two grating pairs. Each grating is for a single channel and each channel yields one-dimensional alignment information at a specific position.

The detector array 40 can make multiple readings of the interference patterns and can verify the accuracy of the signals in a known manner through a detector circuit 41. An analogue to digital converter 43 can provide a digital representation of the detector array output for processing in a computer system 45.

Figure 4:
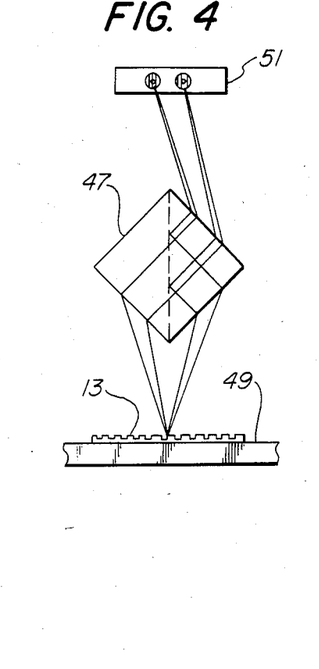
FIG. 4 is an alternative embodiment of the present invention.

FIG. 4 provides a schematic view of another view of a beam splitter 47 in a position detector embodiment with two pairs of diffracted beams from a composite grating on a single surface or object 49 being combined to disclose the operative principles of the present invention. As can be seen, the beam splitter 47 provides a refractive optic element that, as a result of its location and shape, uniquely recombines the plus and minus first order singularly diffracted beams from the object 49. Since the beam splitter 47 is uniquely positioned, it not only accommodates an unobstructive measurement, it also eliminates any necessity to provide a compensator for adjustment of the relative optical path as previously required in interferometric position detectors having multiple reflective and refractive components. Thus, a more economical alignment system with a single conventional optical element can be used in the present invention. In FIG. 4, the displacement of the beam splitter 47 from the object 49 can be about one centimeter while the photodetector array 51 is positioned about 10 centimeters from the beam splitter 47.

The photodetector array 51 is a linear array that can measure the interference fringe patterns over their full spatial extent. It is possible to find the position of the object surface relative to a zero position at any time without having to track or count fringes as the surface moves. Thus, the position detector can statically recognize the fringe pattern, since it is from a known composite grating 13, and can determine the relative location of that fringe pattern to a predetermined reference point. If the position detector has been aligned initially and calibrated, the output from its array 51 can both monitor the object position and determine the extent of movement. The use of local quadratic curve fitting to determine peaks (and/or valley positions) and a linear fitting of the peak positions relative to the expected output of the composite grating 13 can determine the amount of fringe shift from the zero position.

The known peak positions can be stored in a computer or provided in a table to relate pairs of fringe shifts to surface location. The advantage of a composite grating 13 is that the measured peak position from each component period of the composite grating will significantly extend the range of measurement capture as described above. That is, a quadratic curve fitting from two pairs of light beams reflected off of the composite grating 13 will only periodically match at one-half of the product of the individual grating periods.

The photodetector 51 can be a Reticon 1024 cell photodetector array with each cell being 15 μm wide and is apertured to 16 μm height. Photodetectors with a larger number of smaller cells, as mentioned above with the lithography system, can further improve the accuracy.

Figure 7:
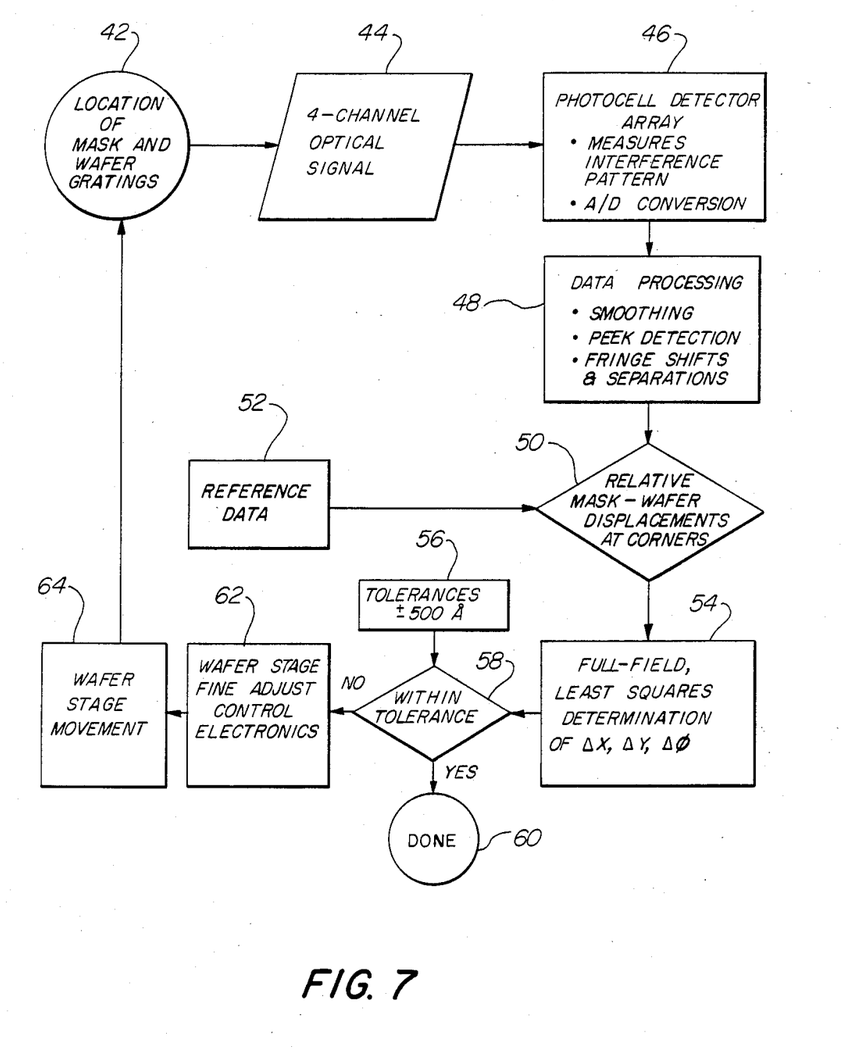
FIG. 7 shows a flow chart of an automatic alignment system.

FIG. 7 discloses a schematic and automatic alignment system that can be controlled by a computer system in accordance with the principles of the present invention. As can be appreciated, the principles of the automatic alignment system are applicable to a position detector but will be described herein with regard to a lithography system. As disclosed above, a four channel optical signal can be derived by the photodetector array after the respective first order diffraction signals are recombined by the beam splitter. The photodetector array measures the interference pattern and is capable of providing an analogue to digital conversion through a scanning of the cells in a conventional manner. The digital information can then be stored in a random access memory for signal processing through an appropriate algorithm of a known type. For example, the signal processing will generally seek to provide a smoothing of the data, a quadratic fitting, peak detection, and phase and frequency calculation.

Figure 5:
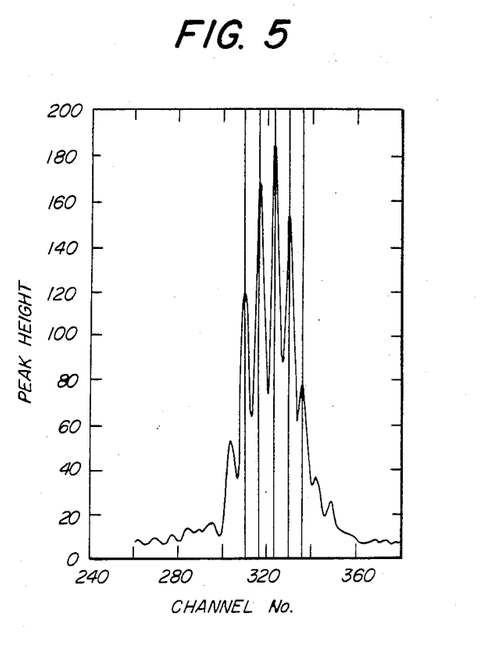
FIG. 5 is a plot of fringe data computer analyzed.

FIG. 5 discloses typical output data that has been plotted for both peak height on the vertical axis and the channel number for detector cell or pixel position as the horizontal axis. Thus, the photodetector reads the intensity pattern of the fringes created by the intersection of pairs of beams. As can be appreciated, the gratings on the mask and wafer will defract four incoming laser beams to four photodetectors via four beam splitters. The digital output of the photodetector circuit represents the fringe patterns. FIG. 5 represents a computer generated plot of the fringe data after the smoothing quadratic fitting and peak detection has been performed. The most important step is quadratic fitting, which is a known mathematical process wherein parabolas are fitted to several data points about each data point in the fringe pattern. Peak detection is accomplished by examining several parameters of the quadratic fit process, such as first and second derivatives, goodness of fit, fringe level, distance to other fringes, etc. The vertical lines in FIG. 5 indicate the computer's recognition of the fringe maximum or peak point. The fringes have uniform frequency, as can be seen by noting the uniform spacing between the vertical lines. The horizontal axis reprepsents the number of the detector cell or the pixel which can range from 1 to 1024 or 1 to 3456 for the detectors mentioned above. The vertical axis can range from 0 to 255, which is the maximum value that one pixel with fringe data represented by an eight bit word can have.

As can be seen, the peaks are higher in the center because the fringes are brighter in this area. This is due to the Gaussian profile of the laser beam intensity. As the figure indicates, the laser spot is bright in the center and tapers to lesser brightness away from the center.

In FIG. 7, the flow chart of the automatic process is shown and step 42 represents the physical location of the mask and wafer gratings, such as disclosed in FIG.

3. The gratings of the mask and wafer will defract four incoming laser beams. As can be appreciated, the full alignment system is duplicated for each channel, although only one is shown in FIG. 3 for ease of illustration. The beam splitters 38 provide the respective four channel optical signals represented in step 44. The function of the photodetector array 40, detector circuit 41, and A/D converter 43 are illustrated as step 46 for measuring the interference pattern realized from the recombined diffracted beams by the beam splitter 38 at the photodetector array 40. A computer can provide the signal processing of the digital output of the photodetector as shown by step 48.

Once the fringe intensity has been detected and stored, it can be treated automatically to produce relative position information. The intensity data is assumed to be stored as a linear array in order of detector channel number, $D_i$, $i=0, 1 \ldots N$, where $D_i$ is the intensity at detector channel number i and N is the number of detector cells spanning the fringe pattern. There are a number of data reduction approaches that might be used, but one that has been shown to be effective is described here. There are four basic steps that follow sequentially: (1) smooth the data (optional), (2) determine fringe peak (and/or valley) positions, (3) determine amount of fringe shift relative to the initial or zero position, and (4) convert fringe shifts to new surface location.

The data may be smoothed effectively by a simple moving average technique $$T_i = \sum_{j=0}^{n} (D_{j-n/2})/(n+1)$$

or by a binomial smoothing which is easy to implement on a computer $$T_i = \sum_{j=-m}^{m} \binom{2m}{m+j} D_{i-j/4m}$$

where $(2m+1)$ is the number of points in the smoothing sequence.

Determination of the fringe peak positions is accomplished by least squares fitting of local segments of the smoothed data to a quadratic function, e.g., $$T_i^q = a_1 \cdot i^2 + b_i \cdot i + c_1$$

where $T_i^q$ is the local best estimate and $a_i$, $b_i$, and $c_i$ are local constants determined over a small range of about six or seven points.

Peaks (or valleys) are detected by computing a goodness of fit test statistic, G, similar to an F test that determines if the quadratic fit has more statistical validity than a linear fit. This statistic is computed as the ratio of the sum of squares of residuals from a linear fit to the sum of squares of residuals from the quadratic fit:

$$G = \frac{\sum_i (T_i - T_i^l)^2}{\sum_i (T_i - T_i^q)^2}$$

where $$T_i^l = d_1 \cdot 1 + e_1$$

is a local best linear least squares estimate. As the local fitting segment is moved along the fringe data, local maxima in G indicate the presence of a peak (or valley) in the fringe intensity whose position, $l_p$ (on the channel number axis) is given by $$l_p = -b_i/2a_i$$

where $a_i$ and $b_i$ are the estimates of the quadratic coefficients from the least square fit with the maximum local value of G.

Once the peak locations versus channel number have been determined for a fringe pattern, the "fringe shift" can be computed. Because the fringes are equally spaced, the peak positions can be represented as $$l_p = s \cdot p + t$$

and the fringe spacing, s, and intercept, t, can be estimated by linear least squares fitting. The "fringe shift," r, is then given by $$r = t/S - \lfloor t/S \rfloor$$

where $\lfloor \ \rfloor$ is the floor function.

Finally, the surface location can be found from the fringe shifts of the two fringe patterns associated with the composite diffraction grating on the surface. For the case of a 6-7 composite, after computing the $r_6$ and $r_7$ shifts, an integer index, $k_{67}$, into a lookup table is computed from $$k_{67} = \lfloor 6 \cdot r_6 - 7 \cdot r_7 + 6.5 \rfloor$$

From the lookup table shown in FIG. A, two sub-indexes, $n_6$ and $n_7$, are found from which the required surface position, $x_{67}$, is computed by $$x_{67} = \frac{6 \cdot (r_6 - n_6) + 7 \cdot (r_7 - n_7)}{4}$$

| FIG. A | | |
|---|---|---|
| $k_{67}$ | $n_6$ | $n_7$ |
| 0 | −1 | 0 |
| 1 | −2 | −1 |
| 2 | −3 | −2 |
| 3 | 3 | 3 |
| 4 | 2 | 2 |
| 5 | 1 | 1 |
| 6 | 0 | 0 |
| 7 | −1 | −1 |
| 8 | −2 | −2 |
| 9 | −3 | −3 |
| 10 | 3 | 2 |
| 11 | 2 | 1 |

Similarly, the surface position, $x_{89}$ is computed from $$x_{89} = \frac{8 \cdot (r_8 - n_8) + 9 \cdot (r_9 - n_9)}{4}$$

where $r_8$ and $r_9$ are determined using the same method as for $r_6$ and $r_7$, and $n_8$ and $n_9$ are found from the lookup table in FIG. B using the index $$k_{89} = \lfloor 8 \cdot r_8 - 9 \cdot r_9 + 8.5 \rfloor$$

| FIG. B | | |
|---|---|---|
| $k_{89}$ | $n_8$ | $n_9$ |
| 0 | −1 | 0 |
| 1 | −2 | −1 |
| 2 | −3 | −2 |
| 3 | 3 | 3 |
| 4 | 2 | 2 |
| 5 | 1 | 1 |
| 6 | 0 | 0 |
| 7 | −1 | −1 |
| 8 | −2 | −2 |
| 9 | −3 | −3 |
| 10 | 3 | 2 |
| 11 | −3 | −3 |
| 12 | −4 | −4 |
| 13 | 4 | 3 |
| 14 | 3 | 2 |
| 15 | 2 | 1 |

The differences $x_{67} - x_{89}$ for each channel represent the local misalignments $X_1$, $X_2$, $Y_1$, $Y_2$, and these four local misalignments are then converted using a least squares calculation to global alignment errors $\Delta X$, $\Delta Y$, and $\Delta \phi$ as shown in step 54.

A decision is made at step 58 as to whether the mask wafer alignment error is within a specified tolerance level which is indicated here at ±500 angstroms. If the alignment error is within the tolerance, then the wafer exposure can take place as shown in step 60. If the alignment error is beyond the predetermined tolerance, then the wafer is adjusted through a conversion of the determined alignment errors in step 62 into actual driving movement of the wafer in step 64. The procedure is then repeated until the desired alignment accuracy is achieved.

Figure 6:
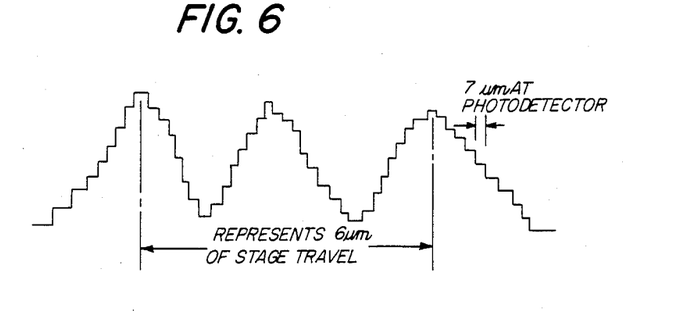
FIG. 6 illustrates the estimation rationale for predicting alignment accuracy in the 200 angstrom range.

Referring to FIG. 6, a schematic representation of the fringes from a 6 μm grating is shown. Each step in the plot corresponds to the size of the smallest photodetector element or pixel (e.g., 7 μm). The number of pixels that generate each fringe is dependent on the beam splitter angle. Changing the beam splitter angle changes the angle of intersection of the beams causing the fringe frequency (or number of pixels between peaks) to change. As can be seen, a shift in the peak pattern by a phase of $4\pi$ is produced by 6 μm of grating motion. Thus, it is possible to use an estimation rationale for predicting alignment accuracies in the 100 angstrom range. A least squares curve fitting method should be able to recognize the digital fringe pattern to better than 0.1 pixel. If a fringe pattern is adjusted to cover 15 pixels, then 15 pixels corresponds to 3 μm which reduces to 0.1 pixel equals to 0.02 μm or 200 angstroms.

As can be appreciated, the minute movement needed to control the wafer stage movement, as schematically illustrated in FIG. 7, in steps 62 and 64 create unique problems in maintaining repeatable accuracy. It is possible to provide calibration patterns that would appear to the optical systems as though it would be a composite grating on the mask and a composite grating on the wafer with no alignment error. These calibration patterns can be used to calibrate or adjust the system either mechanically or, in software, to correct for any optical path length differences that might cause a systematic alignment shift and to provide the reference data of step 52. By providing calibration patterns that disclose either alignment of the fringes or a predetermined misalignment amount of the fringes, the accuracy of the system can be validated prior to a lithographic production process. In operation, the alignment system is automatically integrated into the exposure control of the lithograph process and provides an enabling step before an exposure of the wafer is accomplished.

Figure 8:
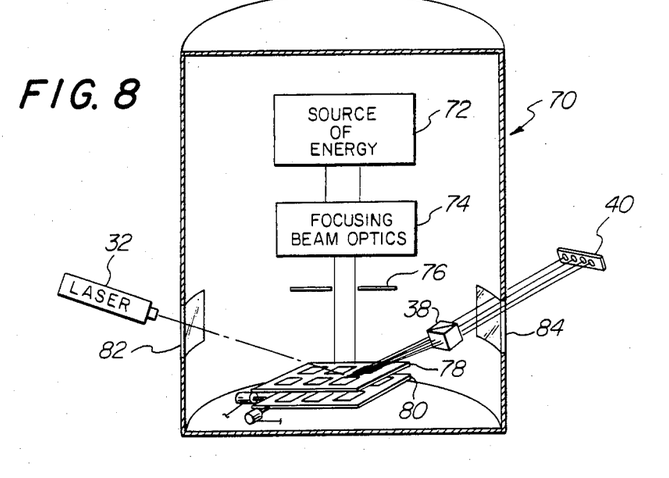
FIG. 8 shows a schematic of a lithography system that can incorporate the automatic alignment system of FIG. 7.

FIG. 8 discloses a schematic representation of a proximity lithography system and includes a vacuum tight housing 70 that supports, at the upper region of the vacuum chamber, a source of energy 72 for providing the ion beam. The ion beam is collimated by conventional ion optics 74 and projected through an aperture member 76 to contact the mask 78 and the substrate 80 to expose the desired pattern from the mask 78 on the substrate 80.

A laser 32 can be positioned to project a laser beam through a window 82 to contact composite gratings on the mask 78 and the substrate 80 as described with reference to FIG. 3. As can be appreciated, four separate lasers (not shown) would be used to provide four channels of position information. Each composite grating produces two pairs of first order diffracted beams that can be collected and coherently combined by the beam splitter 38 to provide an interference fringe pattern on the detector array 40 after it passes through the window 84. Again, four beam splitters (not shown) would be used. The lithography exposure step can then be controlled as described with reference to FIG. 8.

As a result of the present invention, a relatively compact and economical interferometric alignment measurement system is automatized by a computer to improve the performance of, for example, a masked ion beam lithography system to increase both the production rate and accuracy of wafer chip production. The present invention not only permits a precise alignment but is relatively free from the effects of any variations in the spacing between the wafer and the substrate.

As can be appreciate, various modifications can be accomplished in light of the above teachings. It is therefore to be understood that within the scope of the appended claims, the invention may be practiced otherwise than is specifically described above.

What is claimed is:

1. An interferometric alignment system for permitting a reproduction of an image from a mask onto a substrate comprising:
    a substrate having a first diffraction grating formed thereon;
    a mask having a second diffraction grating different from the first diffraction grating, the mask and substrate being provided in close proximity to one another so as to substantially superimpose mask and substrate gratings;
    means for providing a collimated coherent light beam directed so as to impinge on the mask and substrate gratings;
    a unitary optical member for collecting and recombining at least a pair of diffracted light beams from the mask and the substrate to provide an interference pattern; and
    a detector array, positioned such that the interference pattern is realized on the detector array to provide a measurement of the intensity distribution of the interference pattern from which relative alignment of the substrate and mask can be determined.

2. The invention of claim 1 further including means for automatically adjusting the relative position of the substrate and mask from the measurement of the intensity distribution.

3. The invention of claim 1 wherein the optical member for collecting and recombining is a single beam splitter.

4. The invention of claim 1 wherein the detector array comprises a plurality of light receiving members positioned to receive the interference pattern.

5. The invention of claim 2 further including means for comparing the measured relative position of the substrate and mask with a predetermined standard.

6. The invention of claim 2 further including composite gratings as the diffraction grating on the substrate and mask with different component periodicities.

7. The invention of claim 2 wherein the means for providing a collimated coherent light beam and a unitary optical member are offset from a perpendicular plane normal to the diffraction gratings of the mask and substrate.

8. The invention of claim 7 further including a computer means for determining the relative alignment of the substrate and mask and means for automatically adjusting one of the mask and substrate to a position within an acceptable tolerance for reproducing an image.

9. An interferometric alignment measurement system for the precision alignment of a first element and a second element comprising:
a transmissive first diffraction grating associated with the first element;
a second diffraction grating associated with the second element;
means for positioning the first and second elements such that the gratings are superimposed over each other;
means for providing collimated coherent light directed so as to impinge on the grating of the first element and therethrough onto the grating of the second element;
a unitary optical member for selecting and redirecting at least two pair of diffraction beams of a given diffraction order from the gratings to provide a mutually coherent interference pattern of the beams;
a detector array, positioned such that the interference pattern is realized on the detector array to provide a measurement of the intensity distribution of the interference pattern; and
means for determining the relative alignment of the first and second element from the intensity distribution.

10. The invention of claim 9 further including means for comparing the measured relative position of the first and second elements with a predetermined standard.

11. The invention of claim 9 further including composite gratings as the diffraction gratings on the first and second elements with different component periodicities on each diffraction gratings.

12. The invention of claim 10 wherein the means for providing a collimated coherent light beam and a unitary optical member are offset from a perpendicular plane normal to the diffraction gratings of the first and second elements.

13. An interferometric alignment and control system for reproducing an image from a mask onto a substrate comprising:
a substrate having a composite diffraction grating formed thereon;
a mask having a composite diffraction grating different from said first diffraction grating formed thereon, the mask and substrate being provided in close proximity to one another so as to substantially superimpose the mask and substrate gratings in parallel planes;
means for providing a collimated coherent lightbeam directed so as to impinge on and be diffracted from each of the mask and substrate gratings at acute angles to the parallel planes;
detector arrays for providing a measurement of intensity distributions impacting each array; and
a single optical element positioned to select and redirect diffracted light of a predetermined diffraction order from each set of gratings to realize an interference pattern on the detector array whereby the relative alignment of the substrate and mask can be determined from the intensity distributions of the interference patterns.

14. The invention of claim 13 further including means for comparing the measured relative position of the substrate and mask with a predetermined standard.

15. The invention of claim 13 wherein the means for providing a collimated coherent light beam and the single optical element are offset from a perpendicular plane normal to the diffraction gratings of the mask and substrate.

16. The invention of claim 13 further including a computer means for determining the relative alignment of the substrate and mask and means for automatically adjusting one of the mask and substrate to a position within an acceptable tolerance for reproducing an image.

17. An interferometric alignment measurement system for the precision alignment of a first element and a second element comprising:
first composite diffraction grating associated with the first element;
a second composite diffraction grating associated with the second element;
means for positioning the first and second elements such that the gratings are superimposed over each other;
means for providing collimated coherent light directed so as to impinge at an acute angle on the gratings of the first element and therethrough onto the gratings of the second element;
means for selecting and redirecting the plus and minus diffraction beams of a given diffraction order from the gratings to provide mutually coherent interference patterns of the beams;
detector array positioned such that the interference pattern is realized on the detector array to provide a measurement of the intensity distribution of the interference pattern; and
means for automatically determining the relative alignment of the first and second element from the intensity distributions 18. The invention of claim 17 further including means for automatically adjusting the relative alignment until the first and second elements are positioned within predetermined tolerances.

19. The invention of claim 18 wherein each composite diffraction grating is a composite of two gratings of two different periods superimposed on each other.

20. The invention of claim 18 wherein the means for selecting and redirecting includes a single beamsplitter for receiving the plus and minus diffraction beams from the first and second composite diffraction gratings.

21. A position detector for determining relative location of an object, comprising:
a composite diffraction grating provided with the object;
means for providing a collimated coherent light beam directed so as to impinge on the composite diffraction grating;
a unitary optical means for collecting at least two pair of diffracted light beams from the composite diffraction grating;
means for coherently combining the pairs of diffracted light beams to provide an interference fringe pattern; and
means for detecting the interference fringe pattern to provide a measurement of the intensity distribution from which the relative location can be established.

22. The invention of claim 21 wherein the means for detecting the interference fringe pattern includes a linear detector array of photodetector elements.

23. The invention of claim 21 wherein the optical means is a single beamsplitter.

24. The invention of claim 21 wherein the collimated coherent light beam is directed at an acute angle to the surface of the composite diffraction grating and the optical means is spatially positioned to receive the two pairs of diffracted light beams extending at acute angles from the surface of the composite diffraction grating.

25. The invention of claim 21 wherein the composite diffraction grating is a composite of two gratings of two different periods superimposed on the object.

26. An improved lithography system for permitting a reproduction of an image from a mask onto a substrate comprising:
means for providing and directing a source of exposure energy towards the mask and substrate; and
means for aligning the mask and substrate including at least one composite diffraction grating provided on both the mask and substrate, means for providing a collimated coherent light beam directed so as to impinge on the composite diffraction gratings, means for collimating at least two pair of diffracted light beams from each composite diffraction grating, means for coherently combining the pairs of diffracted light beams to provide an interference fringe patterns, and means for detecting the measurement of the intensity distribution from which the relative location of the mask and substrate can be established.

27. The invention of claim 26 further including means for automatically adjusting the relative position of the substrate and mask from the measurement of the intensity distribution.

28. The invention of claim 26 further including means for comparing the measured relative position of the substrate and mask with a predetermined standard.

29. The invention of claim 26 wherein the means for collecting and the means for coherently combining is a unitary optical member.

30. The invention of claim 29 wherein the means for providing a collimated coherent light beam and the unitary optical member are offset from a perpendicular plane normal to the composite diffraction gratings of the mask and substrate.

31. The invention of claim 29 wherein the optical member is a single beam splitter.

32. The invention of claim 26 further including a computer means for determining the relative alignment of the substrate and mask and means for automatically adjusting one of the mask and substrate to a position within an acceptable tolerance for reproducing an image.

33. A position detector for determining relative location of an object, comprising;
a composite diffraction grating provided with the object;
means for providing a collimated coherent light beam directed so as to impinge on the composite diffraction grating;
means for collecting at least two pairs of diffracted light beams from the composite diffraction grating;
means for coherently combining the pairs of diffracted light beams to provide interference fringe patterns; and
means for detecting the interference fringe patterns to provide a measurement of the intensity distribution from which the relative location can be established.

* * * * *

UNITED STATES PATENT AND TRADEMARK OFFICE
CERTIFICATE OF CORRECTION

PATENT NO. : 4,728,193

DATED : March 1, 1988

INVENTOR(S) : John L. Bartelt and Ross D. Olney

It is certified that error appears in the above—identified patent and that said Letters Patent is hereby corrected as shown below:

Page 1, Section [75], line 2, delete "Oleny" and insert therefor --Olney--.

Signed and Sealed this

Twenty-seventh Day of December, 1988

Attest:

DONALD J. QUIGG

*Attesting Officer*  *Commissioner of Patents and Trademarks*